(12) United States Patent
Flint, Jr.

(10) Patent No.: US 7,713,785 B1
(45) Date of Patent: May 11, 2010

(54) SURFACE MOUNTABLE DIRECT CHIP ATTACH DEVICE AND METHOD INCLUDING INTEGRAL INTEGRATED CIRCUIT

(75) Inventor: D. Michael Flint, Jr., Bel Air, MD (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/365,876

(22) Filed: Feb. 4, 2009

Related U.S. Application Data

(62) Division of application No. 11/389,412, filed on Mar. 23, 2006, now Pat. No. 7,511,379.

(51) Int. Cl.
 *H01L 21/00* (2006.01)
(52) U.S. Cl. ................. 438/113; 257/E21.141
(58) Field of Classification Search .......... 257/E21.141, 257/E23.174; 438/113
 See application file for complete search history.

(56) References Cited

U.S. PATENT DOCUMENTS

| | | |
|---|---|---|
| 4,930,216 A | 6/1990 | Nelson |
| 5,126,286 A | 6/1992 | Chance |
| 5,146,308 A | 9/1992 | Chance et al. |
| 5,356,838 A | 10/1994 | Kim |
| 5,606,198 A | 2/1997 | Ono et al. |
| 5,661,901 A | 9/1997 | King |
| 6,188,126 B1 | 2/2001 | Pedersen et al. |
| 6,326,689 B1 | 12/2001 | Thomas |
| 6,379,999 B1 | 4/2002 | Tanabe |
| 6,391,685 B1 | 5/2002 | Hikita et al. |
| 6,414,374 B2 | 7/2002 | Farnworth et al. |
| 6,727,116 B2 | 4/2004 | Poo et al. |
| 6,872,594 B2 | 3/2005 | Gebauer et al. |
| 6,894,386 B2 | 5/2005 | Poo et al. |
| 6,951,801 B2 | 10/2005 | Pozder et al. |
| 7,585,750 B2 * | 9/2009 | Do et al. ............. 438/462 |
| 2007/0004087 A1 * | 1/2007 | Kao et al. ............. 438/113 |

\* cited by examiner

*Primary Examiner*—Thao Le
(74) *Attorney, Agent, or Firm*—Beyer Law Group LLP

(57) ABSTRACT

A surface mountable chip comprises a semiconductor substrate having IC devices formed thereon and also vertically exposed electrical contacts formed as part of the IC fabrication substrate. Metallization lines electrically connect the IC devices with the contacts. The inventor also contemplates wafers having electrical connection vias in place on the wafers in preparation as a product for further fabrication. A method embodiment of the invention describes methods of fabricating such surface mountable chips.

10 Claims, 7 Drawing Sheets

SURFACE MOUNTABLE DIRECT CHIP ATTACH DEVICE AND METHOD INCLUDING INTEGRAL INTEGRATED CIRCUIT

CROSS REFERENCE TO RELATED APPLICATIONS

This application is a divisional of pending U.S. patent application Ser. No. 11/389,412, filed Mar. 23, 2006, entitled "Surface Mountable Direct Chip Attach Device And Method Including Integral Integrated Circuit," which incorporated herein by reference in its entirety.

TECHNICAL FIELD

The invention described herein relates generally to silicon die, and more particularly a silicon die integrally fabricated as part of a surface mountable chip.

BACKGROUND

Common microelectronics packaging involves attaching a chip onto a package or leadframe, wirebonding the chip contacts to the package contacts and then either molding or hermetically sealing the package. The packaged chip is then suitable to be put into its final application, whether that be placed in a socket or soldered to a board. The advantages of this general method are found in the finished parts durability and reliability. These types of packages lend mechanical and environmental protection to the chip within.

Although useful in their own way, such packages have certain limitations and improvements that can be made. The most notable difficulties these packages have are their large size as compared to the chip size, cost of manufacture and cycle time for production. Accordingly, what is needed is a method and apparatus for fabricating an integrated structure including both the IC and the electrical contacts on the same substrate so that the chip can be put directly into its final use without the use of wirebonding. The device will be a solderable surface mounted IC. The inventor of the present invention contemplates such a surface mountable IC device.

SUMMARY OF THE INVENTION

In accordance with the principles of the present invention, the invention includes, among other things, an integrated chip carrier and integrated circuit and methods for its fabrication.

The present invention is directed structure and method for fabrication of a leadless chip carrier. The following description contains specific information pertaining to various embodiments and implementations of the invention. One skilled in the art will recognize that the present invention may be practiced in a manner different from that specifically discussed in the present application. Moreover, some of the specific details of the invention are not discussed in order not to obscure the invention. The specific details not described in the present application are within the knowledge of a person of ordinary skills in the art. The drawings in the present application and their accompanying detailed description are directed to merely example embodiments of the invention. To maintain brevity, other embodiments of the invention that use the principles of the present invention are not specifically described in the present application and are not specifically illustrated by the present drawings.

In one embodiment, the invention comprises a wafer substrate for use in the construction of a plurality of integrated leadless chip carriers. The invention includes a semiconductor wafer having a plurality of integrated circuit regions formed thereon defined by a plurality of saw streets. Each integrated circuit region has edge portions that extend into the saw streets. The wafer further including vias formed in the edge portions of each integrated circuit region where the vias are arranged so that at least a portion of the vias extend into the saw streets.

In yet another embodiment, the invention comprises an integrated leadless chip carrier wherein an integrated circuit is integrated into substrate comprising a surface mountable chip. The chip includes a semiconductor substrate having an integrated circuit region and an edge region. The substrate further includes an integrated circuit fabricated onto the integrated circuit region of the substrate and a plurality of edge mounted electrical contacts formed at the edge of the substrate in the edge region. The edge mounted electrical contacts having side portions exposed at the edges of the substrate and a bottom surface exposed at the bottom of the substrate. Also, the upper portion of the edge mounted electrical contacts includes stacked conductive layers that are in electrical contact with each other and the top of the edge mounted electrical contacts. The carrier further including electrical metallization lines that electrically connect the integrated circuit with the plurality of edge mounted electrical contacts.

In yet another embodiment, a method of forming a surface mountable chip having an integrally formed integrated circuit is disclosed. The method involves providing a semiconductor wafer having a plurality of integrated circuit areas having integrated circuit regions and edge regions, the integrated circuit areas defined by a plurality of saw streets. A plurality of vias are formed in the edge portions of the integrated circuit areas wherein at least a portion of the vias extend into the saw streets. The method includes the operations of filling the vias with a conductive material to form electrical contacts, fabricating integrated circuit devices in the integrated circuit regions, and electrically connecting the integrated circuits with the electrical contacts that are associated with the integrated circuits. The chips are singulated from the wafer by cutting in the saw streets to separate the individual integrated circuit devices and expose side portions of the electrical contact.

These and other aspects of the invention will be disclosed in greater detail in the following detailed description.

BRIEF DESCRIPTION OF THE DRAWINGS

The following detailed description will be more readily understood in conjunction with the accompanying drawings, in which.

It is to be understood that in the drawings like reference numerals designate like structural elements. Also, it is specifically pointed out that the depictions in the drawings are not necessarily to scale.

DETAILED DESCRIPTION OF THE INVENTION

The present invention is directed structure and method for fabrication of a surface mountable chip. In particular, the present invention has been shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the invention. Accordingly, one skilled in the art will recognize that the present invention may be practiced in a manner different from that specifically discussed in the present application. To maintain brevity, other embodiments of the invention that use the principles of the present invention are not specifically described in the present application and are not specifically illustrated by the present drawings.

Figure 1:
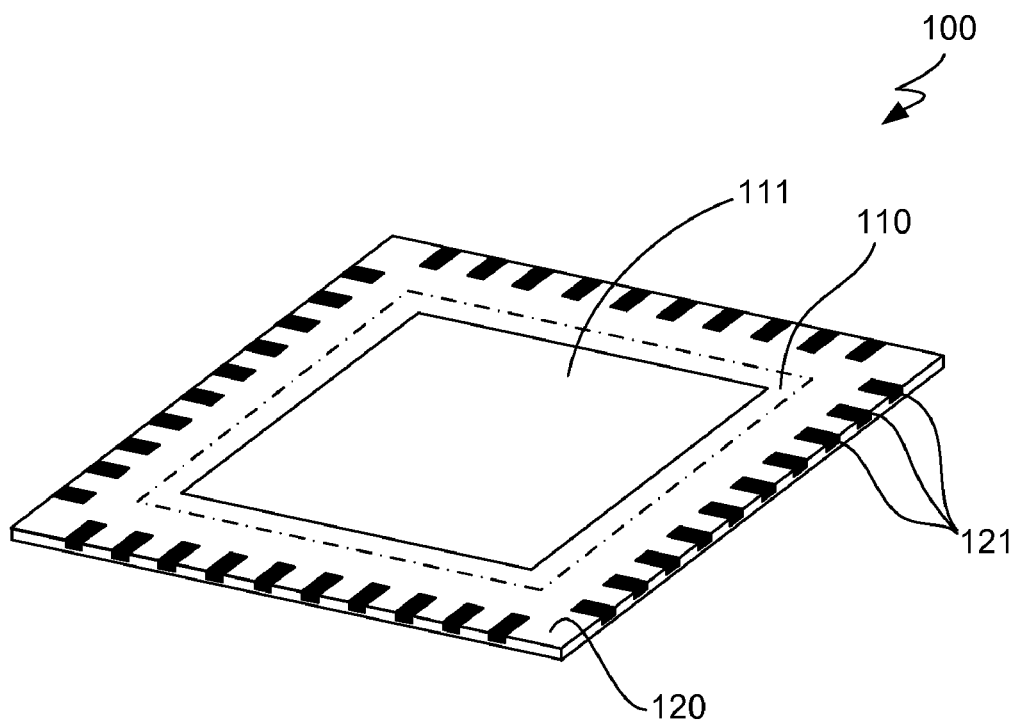
FIG. 1 is a simplified perspective view of surface mountable chip assembly constructed in accordance with the principles of the invention.

FIG. 1 is a perspective view of an embodiment of the invention. A semiconductor substrate 100 is depicted having an integrated circuit portion 110 and edge portions 120. As depicted here the edge portions 120 surround a centrally located integrated circuit portion 110. The substrate 100 is a semiconductor substrate. Examples include, but are not limited to, silicon, gallium arsenide, and other semiconductor substrate materials. An integrated circuit 111 is fabricated directly on the substrate 100 in the integrated circuit portion 110. Additionally, the substrate 100 has electrical contacts 111 formed in the edge portion 110. This configuration forms the contacts 121 directly in the substrate. The bottom and top surfaces, as well as the contact edges, can all be exposed in the contacts 121. Such a configuration facilitates mounting of the embodiment on a circuit board configured to receive a standard IC in a leadless chip carrier. Advantageously, this embodiment dispenses with the need for a separate chip holder and also the need for wire bonded connections between the IC and the electrical contacts of the chip holder. Instead of wire bonds, conductive connections between the electrical contacts 121 and another mounting surface (e.g., a final assembly board) can be formed. For example, such connections can be formed of metals or conductive materials like, for example, solder, which can be preformed, printed, dispensed, or otherwise deposited on the substrate.

Figure 2A:
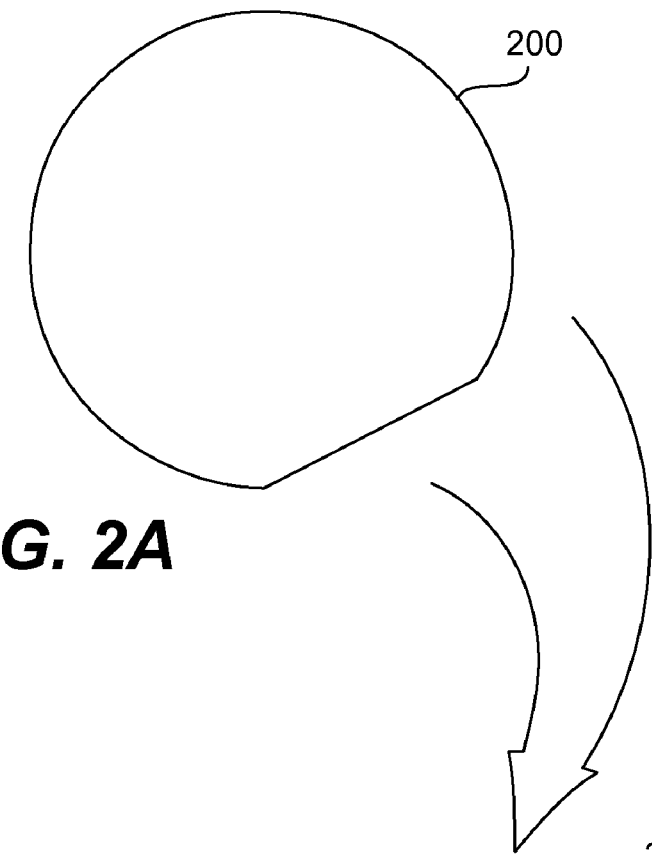
FIGS. 2A and 2B are simplified depictions of a semiconductor wafer and a portion of the wafer, respectively. The portion of the wafer having an integrated circuit area formed thereon.
Figure 2B:
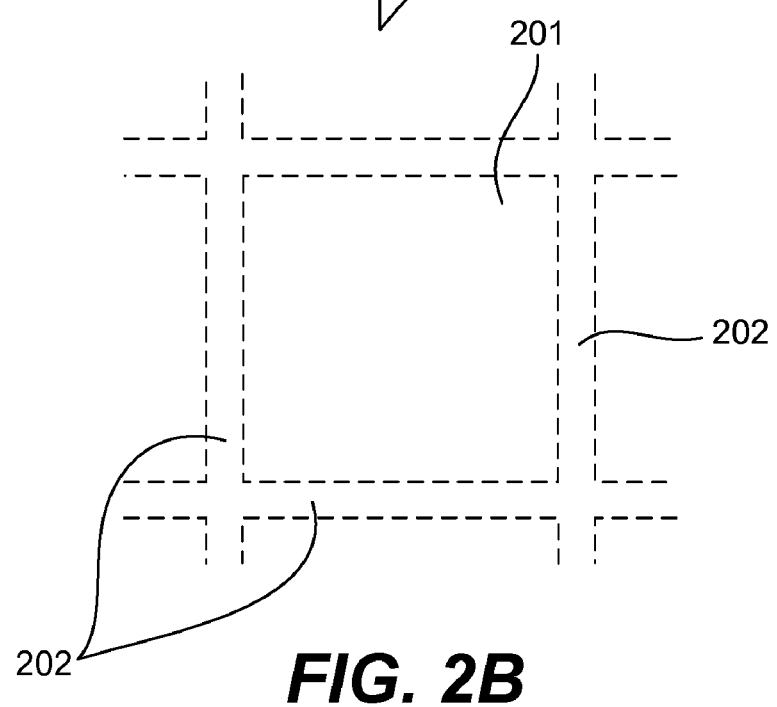

An example process embodiment for fabricating such integrated chip holders is described herein. A semiconductor wafer 200 is provided as shown in FIG. 2A. This wafer can be of any type known in the art. One typical embodiment will employ a standard 200 mm (millimeter) silicon wafer such is used throughout the semiconductor industry. Such wafers are patterned and processed to form individual semiconductor integrated circuit dice. Once completed, the dice are singulated to form individual IC die. FIG. 2B schematically illustrates a portion of the wafer 200 showing a single die 201. The depicted die 201 is shown with saw streets 202 illustrated to define where a cutting apparatus will be used to cut the die into separate die.

Figure 2C:
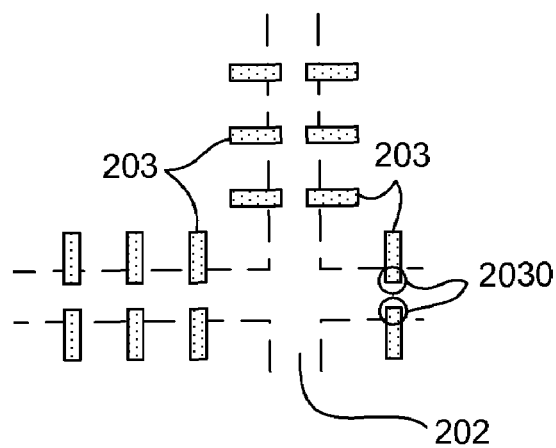
FIGS. 2C, 2D, and 2E are simplified plan views of a portion of a wafer showing saw streets and electrical connectors extending into the streets in accordance with the principles of the invention.
Figure 2D:
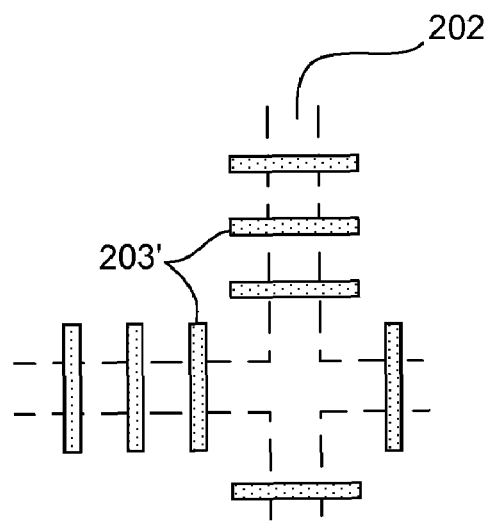
Figure 2E:
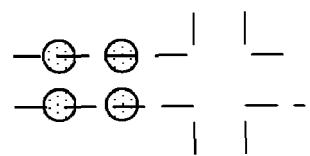

FIGS. 2C, 2D & 2E schematically illustrate closer views of the saw streets and electrical contacts for embodiments of the invention. In all depicted embodiments, the contacts extend into the saw streets 202. Referring first to FIG. 2C, a plurality of electrical contacts 203 are formed at the edge regions of each die 201. The electrical contacts 203 all extend into the saw streets 202. During singulation the cutting process removed all the material in the saw street to segment the die from one another. Typically a saw is used for such a purpose. During singulation the overlapping portions of the contacts 203' are removed leaving exposed the side portions of the contacts 203. FIG. 2D shows a different approach to the same problem. One large electrical contact 203' for each of a pair of adjacent die extends completely across the saw streets 202. Each set of dice has several such adjoined contacts. Again, during singulation the cutting process cuts through the material in the saw streets to segment the die from one another. Such singulation cuts through the extended portions of contacts 203' in the saw streets 202 to expose the side portions of the contacts 203' and to singulate the die. In another embodiment, such as shown in FIG. 2E a plurality of round electrical contacts 203" are formed at the edge regions of each die 201. The round electrical contacts 203" are typically drilled or etched into the substrate and then filled with conductive material. A portion of the round electrical contacts 203" extend into the saw streets 202. As before, during singulation the die are cut apart, and in the process the portions of the contacts 203" in the saw street are also cut away leaving exposed the side portions of the contacts 203".

Figure 3A:
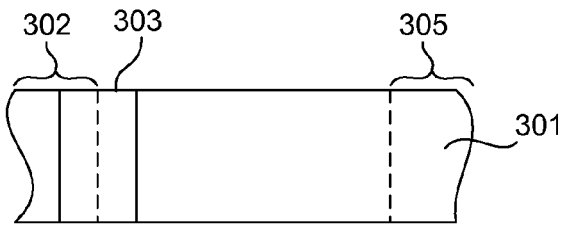
FIGS. 3A and 3B are simplified section and plan views of a portion of a wafer showing saw streets and vias extending into the streets in accordance with the principles of the invention.
Figure 3B:
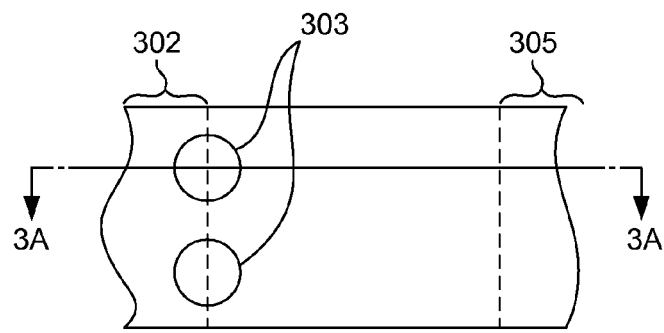

The following figures help illustrate a fabrication process embodiment used to construct an surface mountable chip of the claimed invention. FIGS. 3A and 3B are schematic depictions of a portion of a semiconductor wafer 301. FIG. 3A is a cross-section view of the wafer portion depicted in FIG. 3B. The depicted substrate (wafer) can be a standard wafer or one of many other wafers known to those having ordinary skill in the art. In the depicted embodiment, the wafer is a standard 200 mm silicon wafer about 20 mils thick. The saw street 302 is shown. In this embodiment, vias 303 are made in the wafer 301. Although not strictly necessary, the vias 303 can made completely through both sides of the wafer 301. Additionally, the vias 303 extend into the saw street 302 as shown. There can be any number of vias 303 and the vias can be of any size. However, the major size and spacing determinative factor is the size and spacing of the allotted footprint onto which the chip will be mounted. Commonly, such vias sizes can be from about 150 micrometers (µm) to a few millimeters in diameter (or in width). Such vias can be formed using any of a number of processes known to those having ordinary skill in the art. For example, where round holes are preferred a precision drill can be used to make a number of holes in the substrate.

Figure 4:
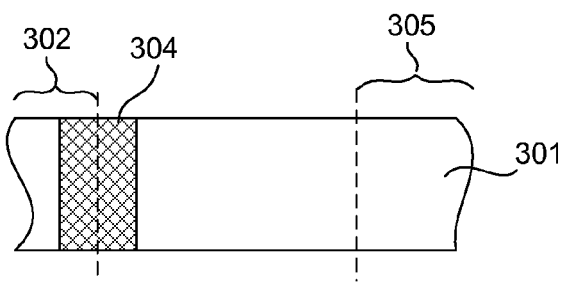
FIG. 4 is a simplified section view of the portion of the wafer shown in FIG. 3A depicting the via fill process in accordance with the principles of the invention.

Alternatively, the vias can be etched into the substrate using a wide range of ordinary process techniques. In alternative embodiments, rectangular, square, or other shaped vias can be formed in the substrate. Such vias can be formed by a number of methods, but etching is a particularly attractive approach due to its flexibility in establishing a wide range of via shape The vias 303 are subsequently filled with a conductive material. Metals such as aluminum and copper would typically be employed. However, the invention is not limited to such, other conductive materials include, but are not limited to materials such as molybdenum, tungsten, or gold. But, the inventor points out that any solderable metals or metal alloys metals that can have a solderable metal electrolessly plated or otherwise adhered to it after singulation can be used. FIG. 4 depicts the via 303 filled with a metal plug 304. In one process, the via 303 can be filled by depositing the desired metal in to the via until it is filled. Alternatively, a seed layer of conductive material can be deposited on the inner walls of the via 303 and then the rest of the plug 304 could be formed by a bulk plating process. For example, electroless plating or electro-plating could be used to form the plug 304. If for example, copper were chosen appropriate barrier layers could be used to seal the wall of the via before the copper seed layer was applied.

The substrate is also patterned and processed to form integrated circuit devices on the integrated circuit portion 305 of the substrate. As is well known in the art, such integrated circuits are formed in many patterned layers of material. In particular, the integrated circuit fabrication process includes metallization layers, which form interconnect circuitry between various circuit elements of the integrated circuit. As part of the metallization process, metal layers are formed on top of the plugs. During metallization processes various layers of metal can be stacked on top of one another over the plug 305. Additionally, among the many metallization layers metal interconnections between the plugs 304 and the circuitry of the integrated circuits can be established.

Figure 5:
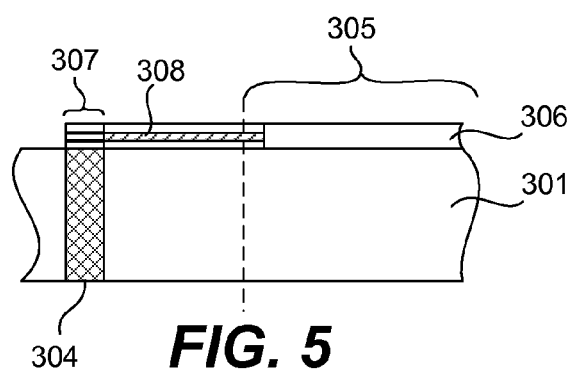
FIG. 5 is a simplified section view of the portion of the wafer shown in FIG. 4 showing the formation of the IC and electrical connections to end connectors in accordance with the principles of the invention.

FIG. 5 is a schematic cross-section view of the substrate 301 after the fabrication of the IC 306 in the integrated circuit portion 305 of the substrate. Also depicted are the layers 307 of conductive material stacked on the plug 304. Also depicted is one of the many conductive metallization lines 308 that interconnect the integrated circuitry 306 with the plugs 304. Such metallization lines can be constructed on any of the many metallization layers.

Figure 6:
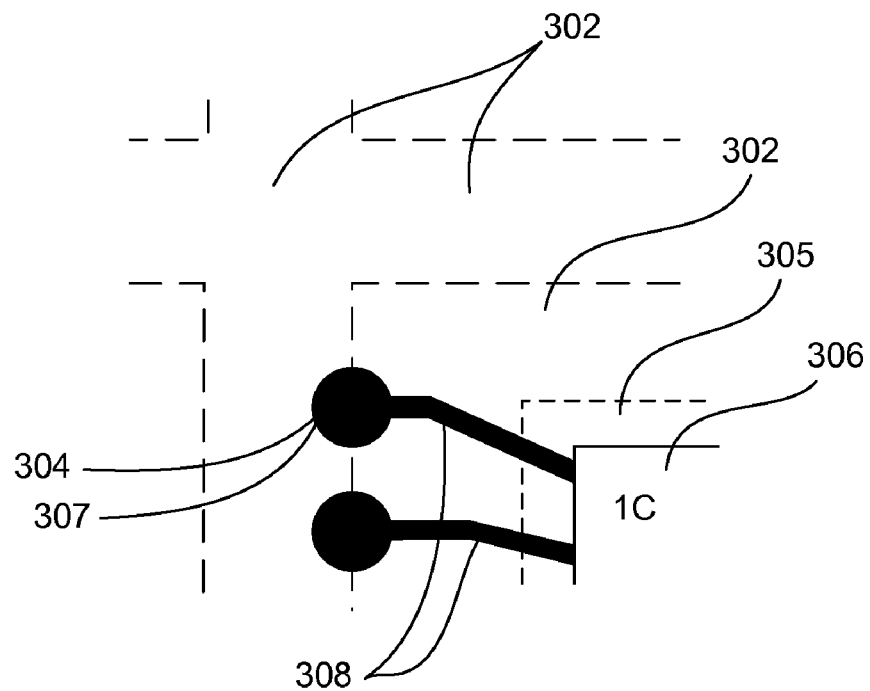
FIG. 6 is a simplified plan view of the portion of the wafer shown in FIG. 5 illustrating the electrical connections between the IC and the end connectors in accordance with the principles of the invention.

FIG. 6 is a top down schematic view of a portion of a substrate constructed in accordance with the principles of the invention. The integrated circuit 306 is depicted in an integrated circuit portion 305 of the substrate. The plug with metallization stacks 304/307 extend into the saw street 302. Additionally, the metal interconnect lines 308 are shown connecting the IC 306 with the plugs.

Figure 7:
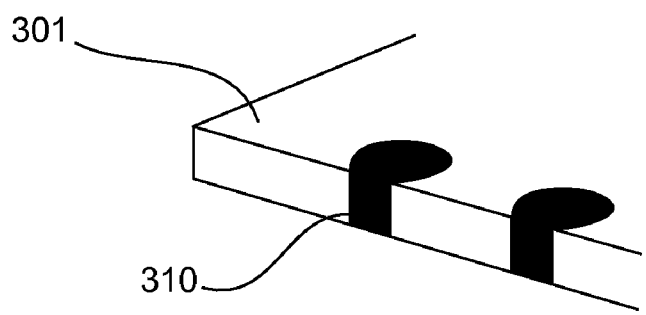
FIG. 7 is a simplified perspective view of the portion of a wafer showing the exposed sides of the end connectors for the singulated wafer in accordance with the principles of the invention.

FIG. 7 shows the substrate 301 after the wafer has been singulated cutting through the saw streets exposing the edge portion of the plug to complete the edge mounted electrical contacts 310.

Figure 8A:
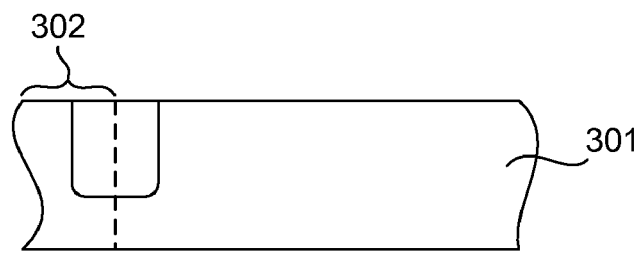
FIGS. 8A, 8B, & 8C are simplified section views of a substrate (wafer) depicting inventive processes used when a via is made that does not pass entirely through the wafer.
Figure 8B:
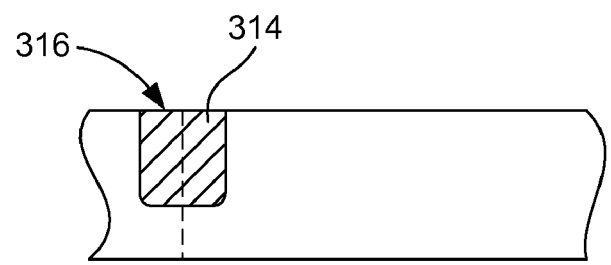
Figure 8C:
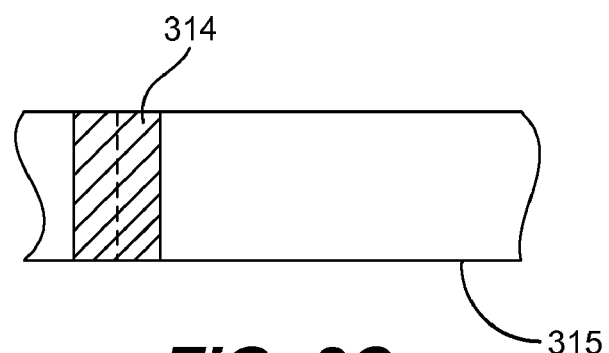

FIG. 8A schematically depicts a related embodiment. A substrate (wafer) 301 as previously described (for example with respect to FIG. 3A, 3B) is shown with saw streets 302 depicted. A via 313 is formed in the wafer 301. Via 313 does not pass all the way through the wafer 301. For example, if a wafer 20 mils thick is used, the via 313 penetrates into the wafer to a depth of in the range of 9 to 18 mils. The inventors point out that any depth can be used, but in one embodiment the via 313 is about 10 mils deep. The via 313 is filled with conductive material 314 as shown in FIG. 8B. The substrate 301 is thinned to expose the backside surface of the electrical contact. This can be achieved either before or after the integrated circuitry is formed on a surface of the substrate. Typically such thinning is achieved by backgrinding the substrate using methods known to those having ordinary skill in the art. A thinned substrate is depicted in FIG. 8C which is shown in readiness for further processing. The backside surface 315 has been removed (by grinding, polishing, etching, or some other process) to expose a bottom surface 316 of the electrical contact 314. Further processing can be performed either before or after the backside thinning. Once the integrated circuits are formed they can be encapsulated, heat sinks and spreaders can be added, and they are singulated into separate dice. It should be noted that the invention can be formed with vias that extend through the entire wafer thickness, thus eliminating the need for backgrinding.

These integrated chip carrier integrated circuit devices dispose of the need for wirebonding to a chip carrier and so are quicker to make.

Figure 9:
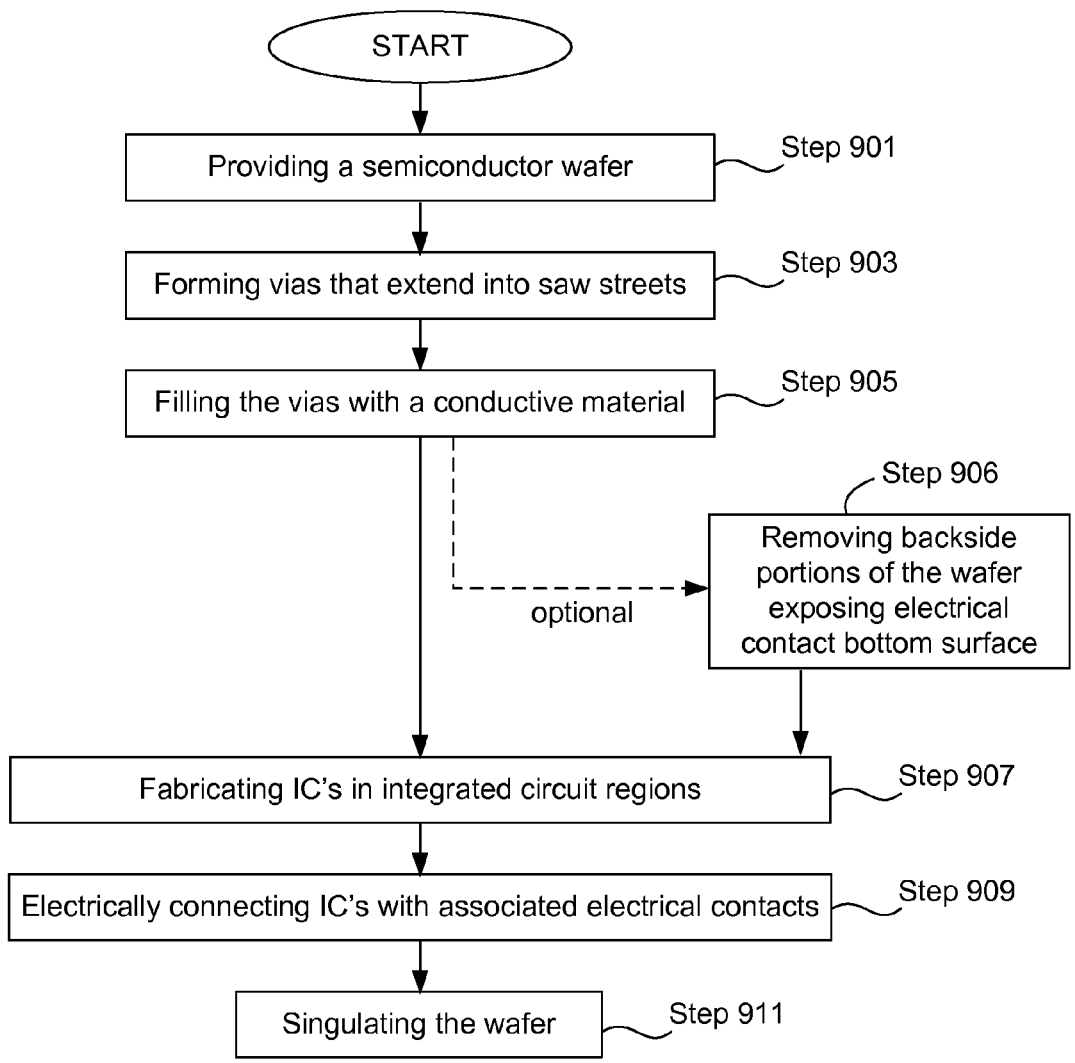
FIG. 9 is a flow diagram illustrating a method embodiment for fabricating an surface mountable chip in accordance with the principles of the present invention.

FIG. 9 depicts a process flow embodiment enabling the fabrication of integrated chip carrier integrated circuit devices in accordance with the principles of the invention. It is pointed out that it is not necessarily required to perform the described process operations in order, although certain process advantages may be obtained by doing so. The inventor contemplates several different process flows including the same steps.

One embodiment of forming an integrated chip carrier IC device involves providing a semiconductor wafer (Step 901). Generally, the wafer comprises a plurality of integrated circuit (die forming) areas. Each integrated circuit area includes an integrated circuit forming region surrounded by edge regions. The separate integrated circuit areas are defined by a plurality of saw streets. A plurality of vias are formed in the edge portions of the integrated circuit areas (Step 903). A portion of each via is configured to extend into the saw streets. Some embodiments include vias that pass completely through the substrate while other embodiments do not. The vias are filled with a conductive material to form electrical contacts (Step 905). Such filling can be accomplished by deposition processes or more typically, by plating processes that are known to those having ordinary skill in the art. Also, in an optional process, backside processing can be conducted to remove portions of the backside of the wafer to expose the bottom of the electrical contacts (Step 906). Typically, such processing is only necessary when the vias do not pass entirely through the wafer.

In continuation, integrated circuit devices are fabricated in the integrated circuit regions (Step 907). Also, the integrated circuits are electrically connected with the electrical contacts that are associated with the integrated circuits (Step 909). This can be accomplished using a number of approaches. One particularly, advantageous approach uses electrically conductive traces formed during metallization processes. In particular, embodiments that employ metallization processes used in fabricating the integrated circuits are advantageous. Such metallization can also be used to create stacked metal contacts on top of the electrical contacts. The wafer can then be singulated by cutting in the saw streets to separate the individual integrated circuit devices and expose side portions of the electrical contact (Step 911). The purpose of the device is to have the ability to solder the completed product to a board or other substrate as required without the need for packaging. This product can be sold as is or in other embodiments further processing can be conducted. Such processing can include, but is not limited to encapsulation, thermal modification (i.e., the addition of heat sinks and spreaders and the like), as well as a number of other processes.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. Further, reference in the claims to an element in the singular is not intended to mean "one and only one" unless explicitly stated, but rather, "one or more". Furthermore, the embodiments illustratively disclosed herein can be practiced without any element, which is not specifically disclosed herein.

I claim:

1. A method of forming a surface mountable chip having an integrally formed integrated circuit, the method comprising:
   providing a semiconductor wafer having a plurality of integrated circuit areas having integrated circuit regions and edge regions, the integrated circuit areas defined by a plurality of saw streets;
   forming a plurality of vias in the edge portions of the integrated circuit areas wherein at least a portion of the vias extend into the saw streets;
   filling the vias with a conductive material to form electrical contacts;
   fabricating integrated circuit devices in the integrated circuit regions;
   electrically connecting the integrated circuits with the electrical contacts that are associated with the integrated circuits; and
   singulating the wafer in the saw streets to separate the individual integrated circuit devices and expose side portions of the electrical contact.

2. A method as in claim 1 wherein forming a plurality of vias in the edge portions comprises forming vias that pass completely through the wafer.

3. A method as in claim 2 wherein filling the vias with a conductive material comprises forming a conductive seed layer in the via; and
   plating a metal material onto the seed layer to fill the via to form the electrical contacts.

4. A method as in claim 3 wherein plating the metal material onto the seed layer comprises electroless plating of the metal material.

5. A method as in claim 3 wherein plating the metal material onto the seed layer comprises electroplating of the metal material.

6. A method as in claim 2 wherein filling the vias with a conductive material comprises depositing a conductive seed layer in the via.

7. A method as in claim 2 wherein filling the vias with a conductive material to form electrical contacts further comprises forming stacked metal layers on top of the conductive material of the electrical contacts.

8. A method as in claim 7 wherein forming the stacked metal layers on top of the conductive material of the electrical contacts is accomplished during the formation of the metallization layers used in fabricating the integrated circuit devices.

9. A method as in claim 1 wherein fabricating the integrated circuit devices in the integrated circuit regions comprises fabricating the integrated circuit devices on a top surface of the wafer; and
   wherein forming a plurality of vias in the edge portions comprises forming vias that have an opening in the top surface of the wafer but do not pass completely through the wafer.

10. A method as in claim 9 further including removing a portion of the back surface of the wafer to expose a bottom surface of the electrical contacts.

* * * * *